United States Patent
Park et al.

(10) Patent No.: US 8,667,704 B2
(45) Date of Patent: Mar. 11, 2014

(54) AIR KNIFE CHAMBER INCLUDING BLOCKING MEMBER

(71) Applicant: LG Chem, Ltd., Seoul (KR)

(72) Inventors: Su-Chan Park, Daejeon (KR); Ye-Hoon Im, Daejeon (KR); Kyoung-Hoon Min, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/735,625

(22) Filed: Jan. 7, 2013

(65) Prior Publication Data

US 2013/0180079 A1    Jul. 18, 2013

Related U.S. Application Data

(63) Continuation of application No. PCT/KR2011/005204, filed on Jul. 14, 2011.

(30) Foreign Application Priority Data

Jul. 14, 2010  (KR) .................... 10-2010-0067948
Jul. 14, 2011  (KR) .................... 10-2011-0069965

(51) Int. Cl.
   *F26B 9/00*    (2006.01)
(52) U.S. Cl.
   USPC ............. 34/78; 34/611; 34/218; 134/104.1; 118/643; 239/594; 428/336; 15/405
(58) Field of Classification Search
   USPC ............ 34/77, 78, 611, 635, 201, 210, 218, 34/242; 134/2, 34, 102.3, 104.1; 118/58, 118/63, 643; 239/104, 521, 594; 428/141, 428/217, 336; 15/405, 306.1
   See application file for complete search history.

(56) References Cited

U.S. PATENT DOCUMENTS

| | | | | |
|---|---|---|---|---|
| 5,379,784 A * | 1/1995 | Nishi et al. | ............. | 134/102.3 |
| 6,073,369 A * | 6/2000 | Yasuyuki | ............. | 34/651 |
| 6,128,830 A * | 10/2000 | Bettcher et al. | ............. | 34/404 |
| 6,282,812 B1 * | 9/2001 | Wee et al. | ............. | 34/464 |
| 6,421,932 B2 * | 7/2002 | Gommori et al. | ............. | 34/488 |
| 7,159,599 B2 * | 1/2007 | Verhaverbeke et al. | ...... | 134/109 |
| 2004/0031167 A1 * | 2/2004 | Stein et al. | ............. | 34/443 |
| 2006/0123658 A1 * | 6/2006 | Izumi | ............. | 34/565 |
| 2007/0107253 A1 * | 5/2007 | Nishiura | ............. | 34/444 |
| 2008/0236627 A1 | 10/2008 | Kominami et al. | | |
| 2008/0244925 A1 * | 10/2008 | Shin | ............. | 34/611 |
| 2009/0223079 A1 * | 9/2009 | Myong | ............. | 34/274 |
| 2011/0147475 A1 * | 6/2011 | Biegler et al. | ............. | 239/1 |
| 2013/0160318 A1 * | 6/2013 | Shroder et al. | ............. | 34/265 |
| 2013/0180079 A1 * | 7/2013 | Park et al. | ............. | 15/405 |

FOREIGN PATENT DOCUMENTS

| | | |
|---|---|---|
| JP | 11-204489 | 7/1999 |
| JP | 2003-083675 | 3/2003 |
| JP | 2006-247541 | 9/2006 |
| JP | 2007-300129 | 11/2007 |
| JP | 2008-253862 | 10/2008 |
| KR | 10-2006-0027597 | 3/2006 |
| KR | 10-2006-0073079 | 6/2006 |

* cited by examiner

*Primary Examiner* — Steve M Gravini
(74) *Attorney, Agent, or Firm* — McKenna Long & Aldridge, LLP

(57) ABSTRACT

Disclosed is an air knife chamber constructed such that water flowing down along a partition wall is allowed to fall in front of a slit. Due to this construction, the water can be effectively removed by air knives, thus contributing to a reduction in the defective proportion of substrates.

18 Claims, 4 Drawing Sheets

AIR KNIFE CHAMBER INCLUDING BLOCKING MEMBER

CROSS-REFERENCE TO RELATED APPLICATION

The present application is a continuation of International Application No. PCT/KR2011/005204 filed on Jul. 14, 2011, which claims priority to Korean Patent Application No. 10-2010-0067948 filed on Jul. 14, 2010 and Korean Patent Application No. 10-2011-0069965 filed on Jul. 14, 2011 in the Republic of Korea, the disclosures of which are incorporated herein by reference.

TECHNICAL FIELD

The present disclosure relates to an air knife chamber, and more specifically to an air knife chamber constructed such that water (or a cleaning liquid) flowing down along a partition wall is allowed to fall in front of the partition wall (or a slit), enabling effective removal of the water by air knives and eventually resulting in a reduction in the defective proportion of substrates.

BACKGROUND ART

Generally, glass substrates for liquid crystal displays (LCDs), plasma display panels (PDPs), etc., are subjected to a wet (cleaning) process in which a cleaning liquid, such as pure water, is supplied to treat the glass substrates. After the cleaning process, the substrates undergo additional processes to remove the cleaning liquid remaining adherent to the surfaces of the substrates. Such additional processes include cleaning liquid treatment and drying.

The process for cleaning liquid treatment is illustrated in FIG. 1. Referring to FIG. 1, after substrates 1 are fed into a closed chamber body 10 through an inlet opening 11, high-pressure air or a high-pressure inert gas from an air knife 14 is sprayed onto the moving substrates 1 to remove impurities, such as water (or a cleaning liquid). The substrates 1 from which the impurities have been removed are discharged to the outside through an outlet opening 12.

The impurities, such as water (or a cleaning liquid), adherent to the substrates 1 are blown away by the high-pressure air or high-pressure inert gas. The blown water (or cleaning liquid) particles are discharged to the outside through the outlet opening 13. A large amount of the air or inert gas released from the air knife 14 creates complex streams inside the chamber body 10. Such air streams cause a part of the water (or cleaning liquid) particles to attach to a partition wall 16.

The water (or cleaning liquid) attached to the partition wall 16 flows down along the partition wall 16 and falls onto the substrates 1. A portion of the water (or cleaning liquid) flowing down along the partition wall 16 falls at the rear of the air or inert gas sprayed from the air knife 14. As a result, the substrates 1 from which water (or cleaning liquid) remains unremoved are discharged to the outside.

Like so, when water (or cleaning liquid) remaining adherent to the substrates 1 discharges to the outside, the number of defects in final products increases.

DISCLOSURE

Technical Problem

The present disclosure is designed to solve the problems of the prior art, and therefore it is an object of the present disclosure to provide an air knife chamber constructed such that water (or a cleaning liquid) flowing down along a partition wall is allowed to fall in front of the partition wall (or a slit), enabling effective removal of the water by air knives and eventually resulting in a reduction in the defective proportion of substrates.

Technical Solution

According to a preferred embodiment of the present disclosure, an air knife chamber includes: a chamber body having an inlet opening through which substrates enter and an outlet opening through which the substrates are discharged; a partition wall provided between the inlet opening and the outlet opening inside the chamber body to divide the internal space of the chamber body into a front portion communicating with the inlet opening and a rear portion communicating with the outlet opening, and having a slit through which the substrates can pass; a blocking member provided to the partition wall above the slit; and air knives adapted to spray a high-pressure gas to remove water present in the substrates, wherein the blocking member prevents the water flowing down along the partition wall from falling onto the substrates.

Preferably, the partition wall and the blocking member are provided obliquely relative to the moving direction of the substrates.

The air knives are preferably positioned close to the slit at the rear of the partition wall so that the high-pressure gas can be sprayed toward the front portion through the slit.

The air knives may also be positioned below the blocking member to allow the high-pressure gas sprayed from the air knives to push the water fallen onto the substrates from the distal end of the blocking member toward the inlet opening.

It is preferred that the blocking member inclines downwardly. In this case, the water flowing down along the partition wall flows down along the blocking member and falls in front of the slit. It is preferred that the blocking member inclines downward at an angle of 20° to 35° to the horizontal.

Alternatively, the blocking member may incline upwardly. In this case, the water flowing down along the partition wall flows in a lateral direction along the blocking member and flows down at a side of the chamber body.

Preferably, the blocking member is positioned at a height of 9 cm to 11 cm from the underlying substrate and has a length (L) of 9 cm to 13 cm.

DESCRIPTION OF DRAWINGS

The present disclosure will be described in detail with reference to the accompanying drawings, in which preferred embodiments of the present disclosure are illustrated. Therefore, the technical spirit of the present disclosure should not be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the embodiments described herein are provided for illustrative purposes only and are not intended to limit the technical scope of the present disclosure. As such, it should be understood that other equivalents and modifications could be made thereto at the time of filing the present application.

Figure 1:
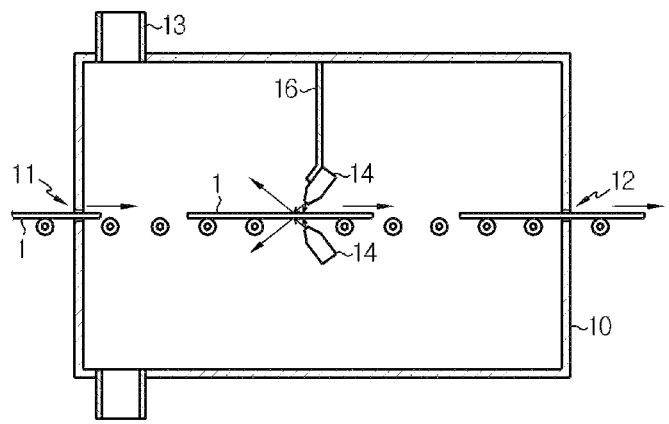
FIG. 1 is a side view illustrating the constitution of an air knife chamber according to the prior art.
Figure 2:
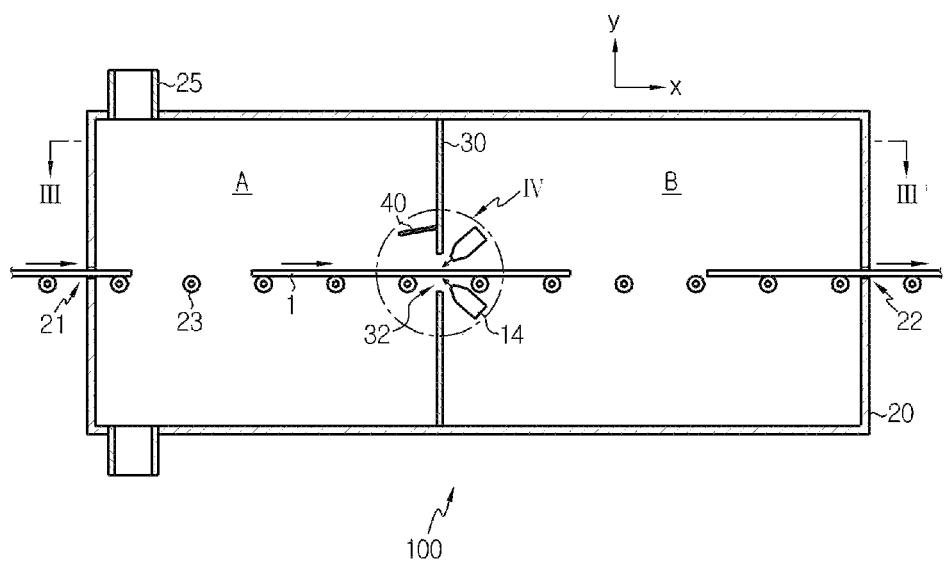
FIG. 2 is a side view illustrating the constitution of an air knife chamber according to a preferred embodiment of the present disclosure.
Figure 3:
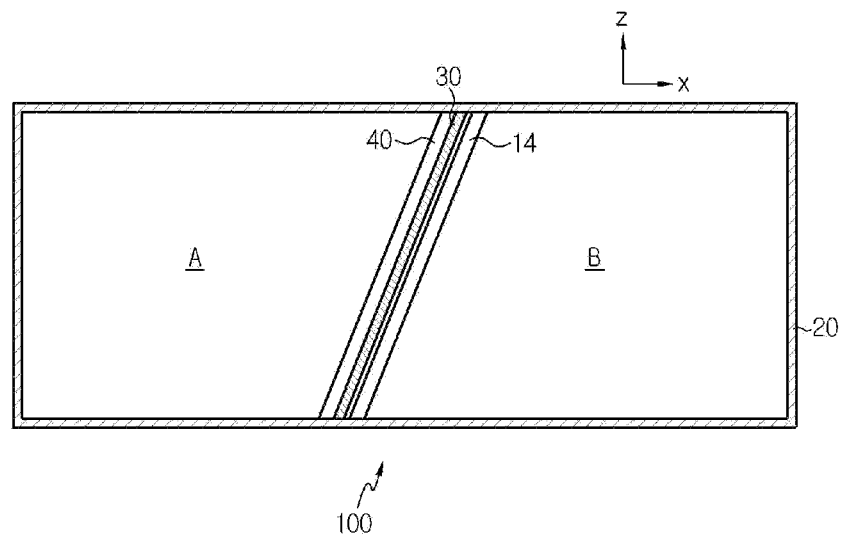
FIG. 3 is a cross-sectional view taken along line of FIG. 2.
Figure 4:
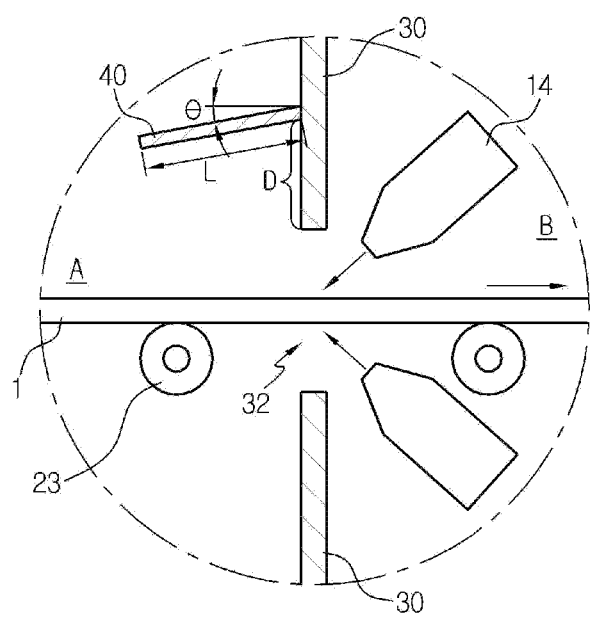
FIG. 4 is an enlarged view of portion IV of FIG. 2.

FIG. 2 is a side view illustrating the constitution of an air knife chamber according to a preferred embodiment of the present disclosure, FIG. 3 is a plan view illustrating the air knife chamber (i.e. a cross-sectional view taken along line III-III'), and FIG. 4 is an enlarged view of portion IV of FIG. 2.

Referring to these figures, the air knife chamber 100 includes a chamber body 20, a partition wall 30 provided inside the chamber body 20, a blocking member 40 provided to the partition wall 30, and air knives 14 adapted to spray high-pressure air.

The chamber body 20 includes an inlet opening 21 through which substrates 1 enter, an outlet opening 22 through which the substrates are discharged, and conveying rollers 23 adapted to move the substrates 1. The substrates 1 entering the chamber body 20 through the inlet opening 21 are moved by means of the conveying rollers 23 and are discharged to the outside through the outlet opening 22. The conveying rollers 23 are rotated by a drive motor (not shown) to move the substrates 1.

The chamber body 20 may further include a vent port 25 through which the air and/or the water (or cleaning liquid) particles are discharged to the outside.

The partition wall 30 is provided between the inlet opening 21 and the outlet opening 22 inside the chamber body 20 to divide the internal space of the chamber body 20 into a front portion (A) communicating with the inlet opening 21 and a rear portion (B) communicating with the outlet opening 22. The partition wall 30 has a slit 32 through which the substrates 1 can pass. The partition wall 30, together with the air knives 14, prevents the water (or cleaning liquid) particles and the air from migrating from the front portion (A) to the rear portion (B).

Air is supplied to the rear portion (B) via an air filter (not shown). This air supply can more effectively prevent the air and/or the water particles from entering the rear portion (B) from the front portion (A).

The blocking member 40 is provided to the partition wall 30 above the slit 32.

The blocking member 40 blocks the water flowing down along the partition wall 30 from dropping toward the slit 32. That is, the water (or cleaning liquid) flowing down along the partition wall 30 flows down along the blocking member 40 and falls in front of the slit 32. The blocking member 40 is preferably dimensioned to have a length equal to or greater than the width of the slit 32.

The blocking member 40 inclines downward at a predetermined angle (θ) to the horizontal. The angle (θ) is preferably between 20° and 35°. If the angle (θ) is smaller than 20°, the water is adsorbed to the lower surface of the blocking member 40, which is undesirable. Meanwhile, if the angle (θ) is larger than 35°, a vortex flow is generated under the blocking member 40, which unfavorably impedes the operation of the air knives 14. The angle (θ) is more preferably about 27.5°.

The blocking member 40 is preferably positioned at a height of 9 cm to 11 cm from the underlying substrate. The length (L) of the blocking member 40 is preferably between about 9 cm and about 13 cm.

As an alternative, the blocking member 40 may be configured to incline upwardly. In this case, the water flowing down along the partition wall 30 is collected in the blocking member.

As another alternative, the blocking member 40 may be configured to incline upwardly and toward one side of the chamber body 20. In this case, the water flowing down along the partition wall 30 flows along the blocking member toward the one side of the chamber body 20. The water may be discharged through a drainage opening (not shown) formed at the one side of the chamber body 20.

The air knives 14 spray high-pressure air or a high-pressure inert gas to remove the water (or cleaning liquid) adherent to the substrates 1. The air knives are arranged in a pair to face each other above and below the passing substrate 1.

The air knives 14 are positioned close to the slit 32. The air knives are preferably inclined such that the high-pressure air can be sprayed toward the front portion (A) through the slit 32, as illustrated in FIG. 4.

Although FIG. 4 illustrates that the air knives 14 are provided close to the slit 32, at least one air knife may be further provided taking into consideration the amount of the water (or cleaning liquid) to be removed. For example, an additional air knife may be provided in the front portion (A), in addition to the air knives 14 provided close to the slit 32.

As illustrated in FIG. 3, all of the partition wall 30, the blocking member 40 and the air knives 14 are preferably inclined relative to the moving direction of the substrates 1. With this configuration, a larger amount of the high-pressure air is sprayed onto the substrates 1, increasing the possibility that impurities such as water (or a cleaning liquid) adherent to the substrates 1 may be removed. For ease of understanding and for convenience, the conveying rollers 23 and the substrates 1 are omitted in FIG. 3.

Figure 5:
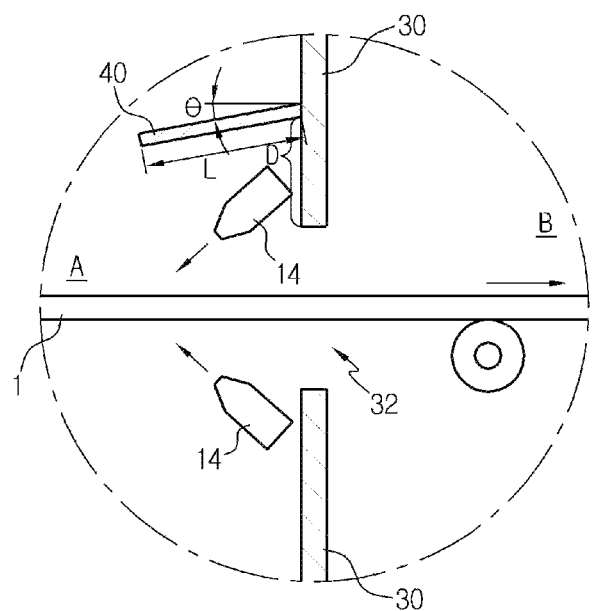
FIG. 5 is an enlarged view illustrating an air knife chamber according to the present disclosure in which air knives are provided below a blocking member.

As illustrated in FIG. 5, air knives 14 may be further provided below the blocking member 40. Preferably, the additional air knives 14 are positioned at the rear of the distal end of the blocking member 40. This arrangement allows the high-pressure gas sprayed from the air knives to push the water fallen onto the substrates from the distal end of the blocking member 40 toward the inlet opening 21.

Figure 6:
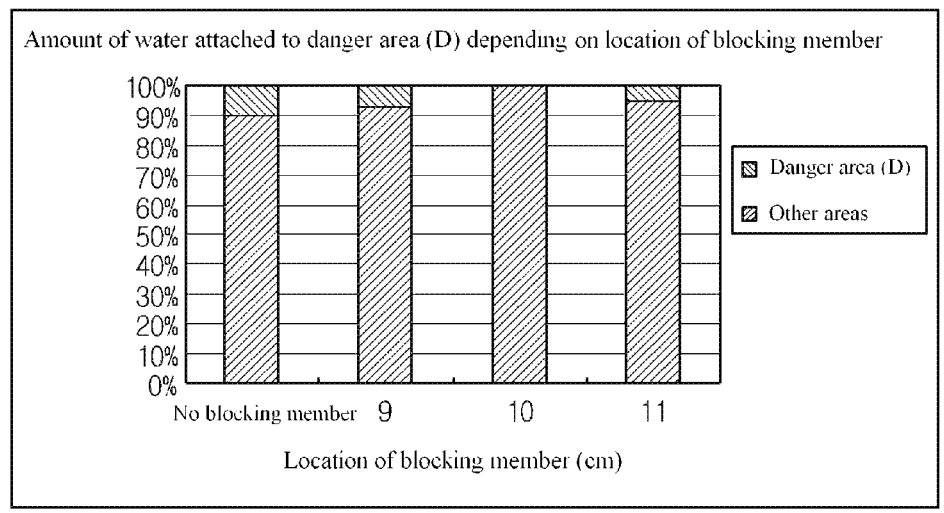
FIG. 6 is a graph comparing the amounts of water attached to a danger area (D) depending on the location of a blocking member in the air knife chamber of FIG. 2.

FIG. 6 is a graph comparing the amounts of water attached to a danger area (denoted by D in FIG. 4) depending on the location of the blocking member 40. Specifically, FIG. 6 graphically compares the amounts of water attached to the danger area (D) (i.e. the surface area of one side of the partition wall that faces the inlet opening 21 and is positioned under the blocking member) depending on the location of the blocking member 40 (i.e. the distance from the underlying substrate) in the air knife chamber 100 having the constitution of FIGS. 2 to 4. The angle (θ) and length (L) of the blocking member 40 were set to 27.5° and 11 cm, respectively.

As can be seen from the graph of FIG. 6, the amounts of water attached to the danger area (D) when the blocking member 40 was provided at heights of 9 cm to 11 cm from the underlying substrate were smaller than when no blocking member was provided. Particularly, when the blocking member 40 was provided at a height of 10 cm from the underlying substrate, the amount of water attached to the danger area (D) was smallest to none.

Figure 7:
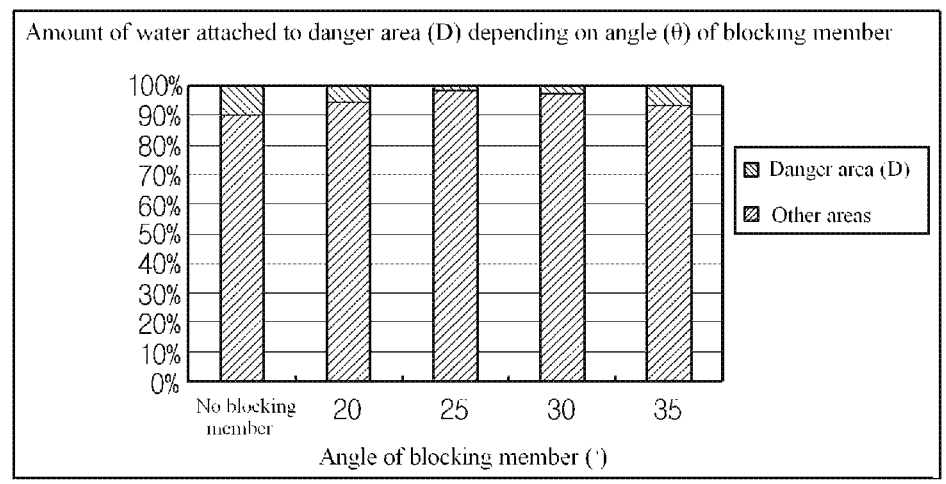
FIG. 7 is a graph comparing the amounts of water attached to a danger area (D) depending on the angle (θ) of a blocking member in the air knife chamber of FIG. 2.

FIG. 7 is a graph comparing the amounts of water attached to the danger area (D) depending on the angle ($\theta$) of the blocking member 40 in the air knife chamber 100 having the constitution of FIGS. 2 to 4. The blocking member 40 was provided at a height of 10 cm from the underlying substrate and had a length (L) of 11 cm.

As can be seen from the graph in FIG. 7, smaller amounts of water were attached to the danger area (D) when the blocking member 40 was inclined at angles ($\theta$) of 20° to 35° than when no blocking member was provided. Particularly, the smallest amount of water was attached to the danger area (D) when the blocking member 40 was inclined at an angle ($\theta$) of 27.5°.

Figure 8:
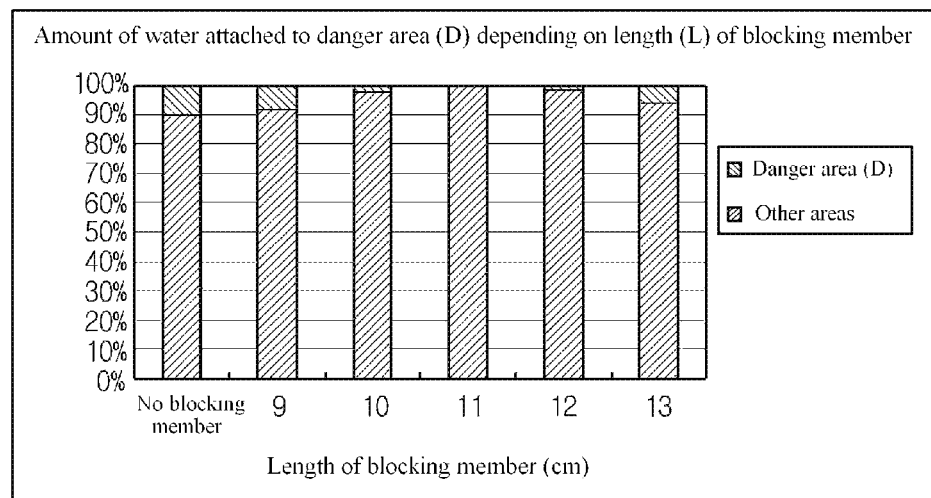
FIG. 8 is a graph comparing the amounts of water attached to a danger area (D) depending on the length (L) of a blocking member in the air knife chamber of FIG. 2.

FIG. 8 is a graph comparing the amounts of water attached to the danger area (D) depending on the length (L) of the blocking member 40 in the air knife chamber 100 having the constitution of FIGS. 2 to 4. The blocking member 40 was provided at a height of 10 cm from the underlying substrate and was inclined at an angle ($\theta$) of 27.5°.

As can be seen from the graph in FIG. 8, smaller amounts of water were attached to the danger area (D) when the blocking member 40 had lengths (L) of 9 cm to 13 cm than when no blocking member was provided. Particularly, when the blocking member 40 had a length (L) of 11 cm, the amount of water attached to the danger area (D) was smallest to none.

The operating procedure of the air knife chamber 100 according to the present disclosure will be explained in the following.

First, the substrates 1 having undergone a cleaning process are fed into the chamber body 20 through the inlet opening 21. The substrates 1 are moved by means of the conveying rollers 23.

Water (or a cleaning liquid) that has been used in the clean process is still adherent to the substrates 1. When the substrates 1 pass through the slit 32, the water (or cleaning liquid) adherent to the substrates 1 is blown away by high-pressure air sprayed from the air knives 14. The blown water (or cleaning liquid) particles are moved by air streams in the front portion (A). A part of the moving water (or cleaning liquid) particles are discharged to the outside through the vent port 25 and the remaining part thereof are attached to the partition wall 30, etc. The water (or cleaning liquid) attached to the partition wall 30 flows down along the partition wall 30 and the blocking member 40 and falls onto the substrates 1. Since the blocking member 40 inclines downwardly at an angle ($\theta$), the water (or cleaning liquid) falls onto the substrates 1 in front of the slit 32 and can be removed by the air knives 14.

Without the blocking member 40, the water (or cleaning liquid) flowing down along the partition wall 30 drops toward the slit 32, and a portion thereof is present at the rear of the high-pressure air sprayed from the air knives 14 and is thus impossible to remove. This problem is solved by the air knife chamber 100 of the present disclosure constructed such that water (or a cleaning liquid) is allowed to fall in front of the slit 32.

A portion of the water (or cleaning liquid) blown by the high-pressure air sprayed from the air knives 14 may be attached to the lower surface of the blocking member 40 and the portion of the partition wall 30 under the blocking member 40. The water attached to the lower surface of the blocking member 40 and the portion of the partition wall 30 under the blocking member 40 flows down along the lower surface of the blocking member 40 and the partition wall 30, respectively, and may again fall onto the substrates 1. The fallen water can be removed by the air knives 14. Like so, the amount of the water (or cleaning liquid) attached to the lower surface of the blocking member 40 and the portion of the partition wall 30 under the blocking member 40 is much smaller than that of the water (or cleaning liquid) attached to the portion of the partition wall 30 over the blocking member 40, which greatly reduces the possibility of contamination of the substrates 1.

INDUSTRIAL APPLICABILITY

The air knife chamber of the present disclosure is constructed such that water (or a cleaning liquid) flowing down along the partition wall is allowed to fall in front of the partition wall (or the slit). Due to this construction, the water can be effectively removed by air knives, thus contributing to a reduction in the defective proportion of substrates.

What is claimed is:

1. An air knife chamber comprising:
a chamber body having an inlet opening through which substrates enter and an outlet opening through which the substrates are discharged;
a partition wall provided between the inlet opening and the outlet opening inside the chamber body to divide the internal space of the chamber body into a front portion communicating with the inlet opening and a rear portion communicating with the outlet opening, and having a slit through which the substrates are capable of passing;
a blocking member provided to the partition wall above the slit; and
air knives adapted to spray a high-pressure gas to remove water present in the substrates,
wherein the blocking member prevents the water flowing down along the partition wall from falling onto the substrates.

2. The air knife chamber according to claim 1, wherein the partition wall, the blocking member and the air knives are provided obliquely relative to the moving direction of the substrates.

3. The air knife chamber according to claim 1, wherein the air knives are positioned close to the slit at the rear of the partition wall so that the high-pressure gas is capable of being sprayed toward the front portion through the slit.

4. The air knife chamber according to claim 1, wherein the air knives are positioned below the blocking member to allow the high-pressure gas sprayed from the air knives to push the water fallen onto the substrates from the distal end of the blocking member toward the inlet opening.

5. The air knife chamber according to claim 1, wherein the blocking member inclines downwardly.

6. The air knife chamber according to claim 5, wherein the water flowing down along the partition wall flows down along the blocking member and falls in front of the slit.

7. The air knife chamber according to claim 6, wherein the blocking member inclines downward at an angle of 20° to 35° to the horizontal.

8. The air knife chamber according to claim 1, wherein the blocking member is inclined upwardly.

9. The air knife chamber according to claim 8, wherein water flowing down along the partition wall flows in a lateral direction along the blocking member and flows down at a side of the chamber body.

10. The air knife chamber according to claim 2, wherein the blocking member is positioned at a height of 9 cm to 11 cm from the underlying substrate and has a length (L) of 9 cm to 13 cm.

11. The air knife chamber according to claim 2, wherein the air knives are positioned close to the slit at the rear of the partition wall so that the high-pressure gas is capable of being sprayed toward the front portion through the slit.

12. The air knife chamber according to claim 2, wherein the air knives are positioned below the blocking member to allow the high-pressure gas sprayed from the air knives to push the water fallen onto the substrates from the distal end of the blocking member toward the inlet opening.

13. The air knife chamber according to claim 2, wherein the blocking member inclines downwardly.

14. The air knife chamber according to claim 13, wherein the water flowing down along the partition wall flows down along the blocking member and falls in front of the slit.

15. The air knife chamber according to claim 14, wherein the blocking member inclines downward at an angle of 20° to 35° to the horizontal.

16. The air knife chamber according to claim 2, wherein the blocking member is inclined upwardly.

17. The air knife chamber according to claim 16, wherein the water flowing down along the partition wall flows in a lateral direction along the blocking member and flows down at a side of the chamber body.

18. The air knife chamber according to claim 2, wherein the blocking member is positioned at a height of 9 cm to 11 cm from the underlying substrate and has a length (L) of 9 cm to 13 cm.

* * * * *